United States Patent
Kim

(10) Patent No.: US 12,001,194 B2
(45) Date of Patent: Jun. 4, 2024

(54) SUBSTRATE PROCESSING APPARATUS, METHOD OF CONTROLLING THE SAME, AND STORAGE MEDIUM HAVING STORED THEREIN PROGRAM THEREOF

(71) Applicant: SEMES CO., LTD., Cheonan-si (KR)

(72) Inventor: Seung Yeon Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 522 days.

(21) Appl. No.: 16/656,572

(22) Filed: Oct. 17, 2019

(65) Prior Publication Data

US 2020/0125075 A1 Apr. 23, 2020

(30) Foreign Application Priority Data

Oct. 18, 2018 (KR) ........................ 10-2018-0124401

(51) Int. Cl.
*G05B 19/41* (2006.01)
*G05B 19/418* (2006.01)
(Continued)

(52) U.S. Cl.
CPC ...... *G05B 19/4184* (2013.01); *H01J 37/3288* (2013.01); *G05B 2219/45031* (2013.01); *H01J 37/3211* (2013.01); *H01J 37/32449* (2013.01); *H01J 37/32724* (2013.01); *H01J 37/32816* (2013.01); *H01J 2237/186* (2013.01); *H01J 2237/2485* (2013.01);
(Continued)

(58) Field of Classification Search
CPC ....... G05B 2219/45031; G05B 19/4184; H01J 37/3288; H01J 37/3211; H01J 37/32449; H01J 37/32724; H01J 37/32816; H01J 2237/186; H01J 2237/2485; H01J 2237/332; H01J 2237/3341; H01L 21/67017

See application file for complete search history.

(56) References Cited

U.S. PATENT DOCUMENTS 8,612,038 B2 12/2013 Kobayashi et al.
2007/0227448 A1* 10/2007 Tomine ............. H01L 21/67276
118/695

(Continued)

FOREIGN PATENT DOCUMENTS

| CN | 101802977 | 8/2010 |
|---|---|---|
| JP | 2007-329345 | 12/2007 |
| KR | 10-2017-0089288 | 8/2017 |

OTHER PUBLICATIONS

Kimura Yoshikazu, "Substrate processing equipment" (english translation, ip.com), Jul. 10, 2003, ip.com machine translation (Year: 2003).*

(Continued)

*Primary Examiner* — Christopher W Carter

(57) ABSTRACT

Disclosed is a substrate processing apparatus including one or more operation elements, the substrate processing apparatus includes a processing unit controlling operation of the substrate processing apparatus, and a controller controlling independently the one or more operation elements of the substrate processing apparatus, monitoring operation of the processing unit, and maintaining operation states of the one or more operation elements when the operation of the processing unit is restarted or terminated.

7 Claims, 8 Drawing Sheets

(51) Int. Cl.
*H01J 37/32* (2006.01)
*H01L 21/67* (2006.01)

(52) U.S. Cl.
CPC . *H01J 2237/332* (2013.01); *H01J 2237/3341* (2013.01); *H01L 21/67017* (2013.01)

(56) References Cited

U.S. PATENT DOCUMENTS

| | | | |
|---|---|---|---|
| 2010/0292809 A1* | 11/2010 | Kobayashi | G05B 19/4148 700/12 |
| 2010/0332201 A1* | 12/2010 | Albarede | H01J 37/32935 703/2 |
| 2016/0011582 A1* | 1/2016 | Shirose | G05B 19/406 700/79 |
| 2019/0035607 A1 | 1/2019 | Kim et al. | |

OTHER PUBLICATIONS

Nishimura Maki, "Control device and control method of slave device" (english translation, ip.com), Sep. 20, 2018, ip.com machine translation (Year: 2018).*

Toshiji Miki, "Apparatus Control System" (JP 2010002159A English translation), Jun. 23, 2008, Espacenet English translation for application JP 2010002159A (Year: 2008).*

* cited by examiner

SUBSTRATE PROCESSING APPARATUS, METHOD OF CONTROLLING THE SAME, AND STORAGE MEDIUM HAVING STORED THEREIN PROGRAM THEREOF

CROSS REFERENCE TO RELATED APPLICATION

The present application claims priority under 35 U.S.C. § 119 to Korean Patent Application No. 10-2018-0124401, filed Oct. 18, 2018 in the Korean Intellectual Property Office, the disclosure of which is incorporated by reference herein in its entirety.

BACKGROUND OF THE INVENTION

Field of the Invention

The present invention relates to a substrate processing apparatus, a method of controlling the same, and a storage medium thereof. More particularly, the present invention relates to a substrate processing apparatus, a control method therefor, and a storage medium, which may be used to manufacture a semiconductor.

Description of the Related Art

Generally, semiconductor devices may be formed on a silicon wafer used as a semiconductor substrate by repeatedly performing a series of manufacturing processes.

The semiconductor devices may be manufactured by a substrate processing apparatus. Overall control for a conventional substrate processing apparatus may be performed by an operating system (OS).

After the OS is updated, the operation of the substrate processing apparatus may be restarted for updates to take effect normally or may be terminated unexpectedly due to bugs. In this situation, the operation of a fieldbus driver (FD) that is included in the OS and controls individual parts constituting the substrate processing apparatus may be terminated and parametric values of the individual parts controlled by the FD may be also initialized. For example, a vacuum state inside a chamber may be sharply changed, or gas supplied into the chamber may be shut off.

Accordingly, since the vacuum state or temperature inside the chamber should be re-established to a state immediately before the operation of the substrate processing apparatus is terminated as the substrate processing apparatus is re-operated, preparation time for the substrate processing apparatus may take a long time in some cases. Moreover, when some parts are damaged according to a sudden change inside the chamber, replacement of the parts is required and thus operation rate or maintenance cost of the substrate processing apparatus may be increased.

Documents of Related Art (Patent Document 1) Korean Patent Application Publication No. 10-2017-0089288.

SUMMARY OF THE INVENTION

Accordingly, the present invention has been made keeping in mind the above problems occurring in the related art, and the present invention is intended to propose a substrate processing apparatus, a control method therefor, and a storage medium, wherein, even when the substrate processing apparatus is restarted, individual parts may be restored to states thereof immediately before the operation of the substrate processing apparatus is terminated.

In order to achieve the above object, according to one aspect of the present invention, there is provided a substrate processing apparatus including one or more operation elements, the substrate processing apparatus includes: a processing unit controlling operation of the substrate processing apparatus; and a controller controlling the one or more operation elements independently in the substrate processing apparatus, monitoring operation of the processing unit, and maintaining operation states of the one or more operation elements when the operation of the processing unit is restarted or terminated.

When the operation of the processing unit is restarted or terminated, the controller may maintain entirely or selectively the operation states of the one or more operation elements.

When the operation of the processing unit is restarted or terminated, the controller may receive maintenance ranges of the operation states of the one or more operation elements from an outside.

The substrate processing apparatus may include: a storage unit where operation data for operation conditions of the one or more operation elements is stored. Wherein the controller may reset the one or more operation elements on the basis of the operation data stored in the storage unit, or may load the operation data stored in the storage unit to the processing unit.

According to one aspect of the present invention, a control method for the substrate processing apparatus may include: controlling software and operation elements of the substrate processing apparatus, wherein controls for the software and the operation elements are performed independently from each other; monitoring that the operation of the substrate processing apparatus is restarted or terminated; determining whether the operation of the substrate processing apparatus is restarted or terminated; and maintaining the operation states of the operation elements, when the operation of the substrate processing apparatus is restarted or terminated.

The control method may include: storing the operation data for the operation conditions of the operation elements; and resetting the one or more operation elements on the basis of the loaded operation data, when the operation of the substrate processing apparatus is restarted or terminated.

In the maintaining, when the operation of the substrate processing apparatus is restarted or terminated, the operation states of the one or more operation elements may be entirely or selectively maintained.

The control method may include: determining maintenance ranges of the operation states of the operation elements, when the operation of the substrate processing apparatus is restarted or terminated.

The control method may include: inputting maintenance ranges of the operation states of the operation elements from the outside, when the operation of the substrate processing apparatus is restarted or terminated.

According to one aspect of the present invention, a storage medium may store a control program running on a computer, wherein during running on the computer, the control program may allow the computer to control the substrate processing apparatus by performing the control method.

According to the embodiment of the present invention, the substrate processing apparatus is configured such that the operation elements can be independently controlled by the controller. Accordingly, even when the operation of the processing unit is restarted or terminated, the operation elements can be maintained without initialization.

Since the inside state of the chamber can be maintained after the substrate processing apparatus is restarted, time is not required to re-establish the inside state of the chamber when the processing unit is restarted. That is, after the OS is reset due to regular maintenance or abnormalities of the substrate processing apparatus, operational inefficiency by restarting the substrate processing apparatus can be reduced, and operational cost of the substrate processing apparatus can be significantly reduced.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
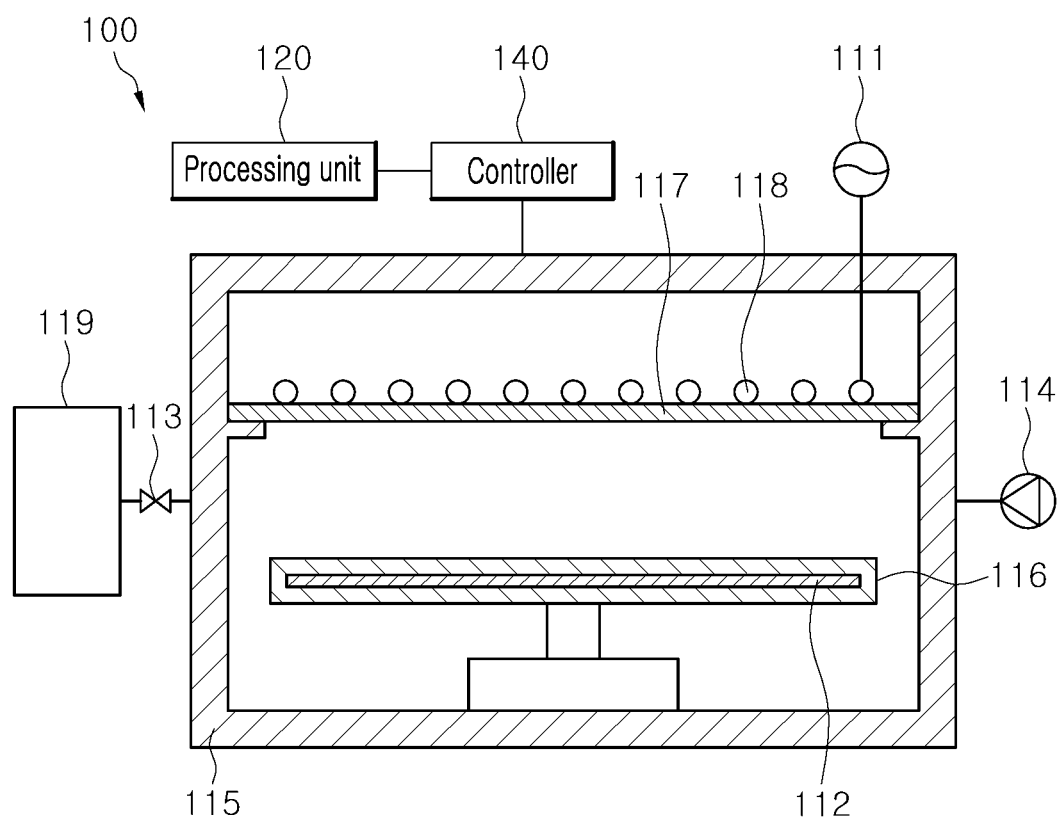
FIG. 1 is a view showing a substrate processing apparatus according to an embodiment of the present invention.

Hereinbelow, exemplary embodiments of the present invention will be described in detail with reference to the accompanying drawings such that the invention can be easily embodied by one of ordinarily skill in the art to which the invention belongs. Various changes to the embodiments of the invention are possible, and the scope of the invention is not limited to the embodiments described below.

In order to clearly describe the present invention, elements incorporated herein will be omitted when it may make the subject matter of the present invention unclear, and the same reference numerals will be used throughout the specification to refer to the same or like elements or parts.

In addition, in various embodiments, elements having the same configuration will be described with the same reference numerals in only the exemplary embodiment, and in other embodiments, only elements different from the exemplary embodiment will be described.

In the specification, it will be understood that when an element is referred to as being "connected" to another element, it can be "directly connected" to the other element or "indirectly connected" to the other element with intervening elements in between. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Before describing a substrate processing apparatus according to an embodiment of the present invention in detail, an example of an internal structure of the substrate processing apparatus will be described.

Referring to FIG. 1, the substrate processing apparatus 100 according to the embodiment of the present invention may include a chamber 115, an electrostatic chuck 116, a gas tank 119, a vacuum pump 114, and a power source 111.

The chamber 115 has an interior space. A substrate may be processed in the interior space of the chamber 115. The electrostatic chuck 116 may be provided on a bottom surface of the chamber 115. The substrate may be seated on the electrostatic chuck 116. A heater 112 may be disposed inside the electrostatic chuck 116 to heat the electrostatic chuck 116.

Gas may be stored in the gas tank 119. When a gas valve 113 is operated, the processing gas necessary for generating plasma may be supplied into the chamber 115. The vacuum pump 114 adjusts pressure in the chamber 115. The power source 111 supplies a radio frequency (RF) current necessary for generating plasma to a coil 118 located on a dielectric 117 in the chamber 115.

In a state where the substrate is located on the electrostatic chuck 116, when the gas valve 113 is operated, the processing gas is supplied into the internal space of the chamber 115. When the RF current is applied to the coil 118, plasma is generated in the interior space of the chamber 115, so that a surface of the substrate may be etched or a thin film may be deposited on the surface of the substrate. In a substrate processing process, the electrostatic chuck 116, the gas valve 113, the vacuum pump 114, and the power source 111 may be operated as described above.

However, although the substrate processing apparatus 100 is described with the example for convenience of description, the substrate processing apparatus 100 may selectively include operation elements 110 such as the electrostatic chuck 116, the gas tank 119, the vacuum pump 114, and the power source 111 or some of the operation elements 110 may be replaced with others. Therefore, the substrate processing apparatus 100 according to the embodiment of the present invention is not limited to the above-described structure.

Hereinbelow, the substrate processing apparatus 100 according to the embodiment of the present invention will be described in detail.

Figure 2:
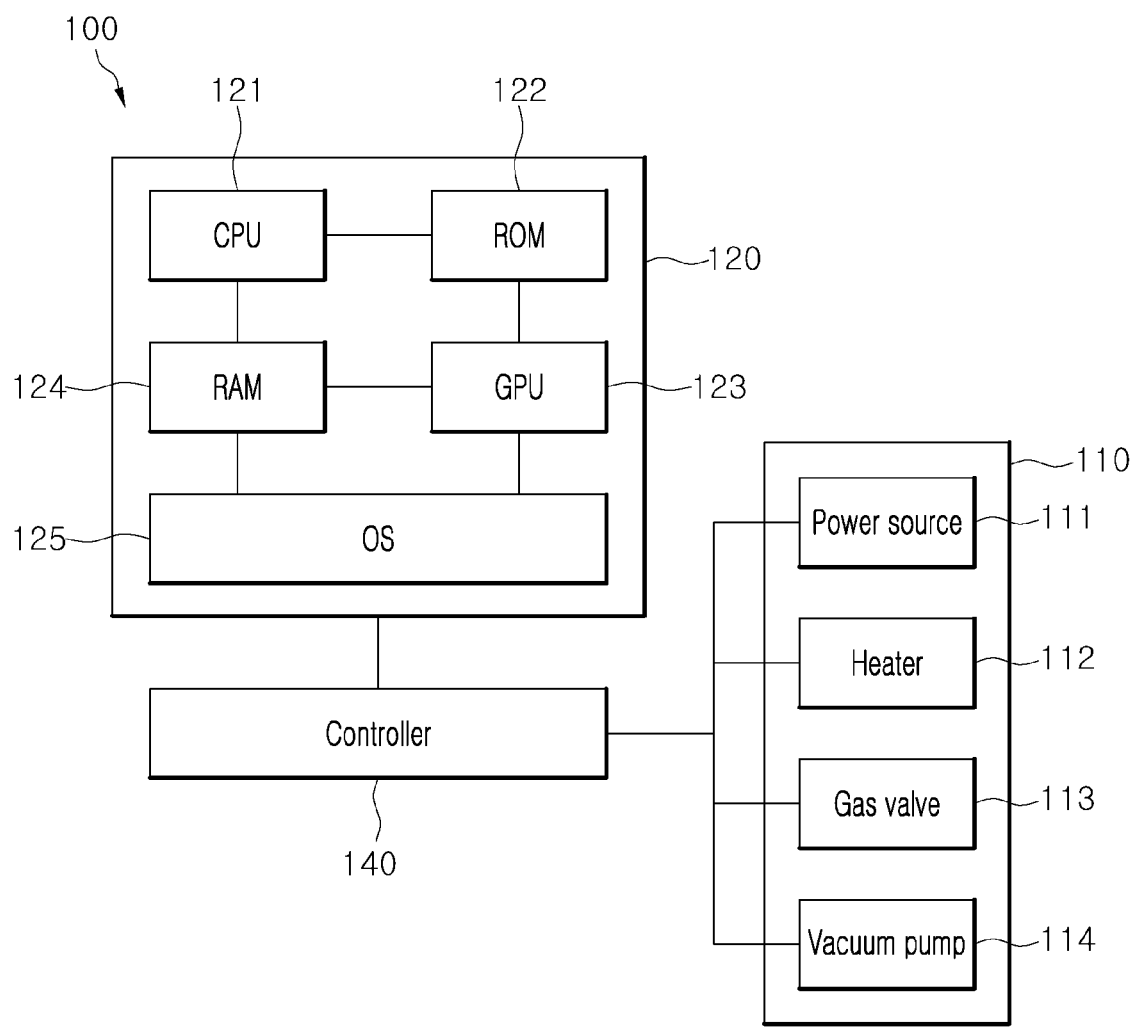
FIG. 2 is a block diagram showing the substrate processing apparatus according to the embodiment of the present invention.

Referring to FIG. 2, the substrate processing apparatus 100 according to the embodiment of the present invention including one or more operation elements 110 includes a processing unit 120 and a controller 140.

The processing unit 120 may control operation of the substrate processing apparatus 100. Specifically, the processing unit 120 may control software except hardware in the substrate processing apparatus 100.

For example, the processing unit 120 may include: a central processing unit (CPU) 121 performing operation processing; a read-only memory (ROM) 122 configuring of a hard disk, a memory device, etc.; a graphic processing unit (GPU) 123 controlling a display screen outputting an operation situation of the substrate processing apparatus 100; a random-access memory (RAM) 124 storing volatile data for some time; and an operating system (OS) 125 controlling overall operation of the substrate processing apparatus 100.

Meanwhile, a program for controlling the substrate processing apparatus 100 and recipe data specifying control conditions may be stored in the ROM 122 functioning as a storage medium. The overall operation of the substrate processing apparatus 100 may be controlled by the processing unit 120 and the controller 140 to be described below.

After the OS is updated, the operation of the processing unit 120 may be restarted for updates to take effect normally or may be terminated unexpectedly due to bugs and power outage.

The controller 140 may control the one or more operation elements 110 independently from software control and monitor operation of the processing unit 120. For example, the controller 140 may control the power source 111 to apply the RF current to the coil 118. In addition, the controller 140 may control the heater 112 to control temperature of the electrostatic chuck 116.

In addition, the controller 140 may control the gas valve 113 to supply or shut off the gas to the chamber 115. The controller 140 may control the vacuum pump 114 to control a vacuum state inside the chamber 115. The controller 140 may maintain operation states of the one or more operation elements 110, when the operation of the processing unit 120 including the program is restarted or terminated.

Meanwhile, the operation elements 110 may be the heater 112, the power source 111, the gas valve 113, the vacuum pump 114, and the like. However, the operation elements 110 are not limited thereto, and may be various components constituting the substrate processing apparatus 100.

The above-described processing unit 120 generally controls the substrate processing apparatus 100, but does not control directly the operation elements 110, and the controller 140 may control the operation elements 110 independently in the substrate processing apparatus 100. Accordingly, when the operation of the processing unit 120 is restarted or terminated, the controller 140 may control the operation elements 110 to maintain current operation states thereof.

For example, when the inside of the chamber 115 immediately before the operation of the processing unit 120 is terminated is in the vacuum state, the controller 140 may maintain the vacuum state inside the chamber 115 even when the operation of the processing unit 120 is terminated. In addition, when the temperature of the electrostatic chuck 116 immediately before the operation of the processing unit 120 is terminated is 100 degrees, the controller 140 may continuously control the heater 112 to maintain the electrostatic chuck 116 at 100 degrees even when the operation of the processing unit 120 is terminated.

Meanwhile, when the operation of the processing unit 120 is restarted or terminated, the controller 140 may entirely or selectively maintain the operation states of the one or more operation elements 110.

For example, the controller 140 may shut off the power source 111 supplying the RF current to the coil 118 and may prevent the gas from being supplying into the chamber 115 while maintaining the vacuum state inside the chamber 115 and the temperature of the electrostatic chuck 116. Accordingly, as generation of plasma is stop, power consumption may be reduced, and the operation elements 110 inside the chamber 115 may be prevented from being damaged by the plasma. Meanwhile, the controller 140 may maintain only the vacuum state inside the chamber 115.

The controller 140 may determine maintenance ranges of the operation states of the one or more operation elements 110. The controller 140 may entirely or selectively maintain the operation states of the one or more operation elements 110 in response to an operation situation of the processing unit 120.

For example, the controller 140 determines whether the operation of the processing unit 120 is stably restarted by receiving a restart signal by the updates of the OS or is forcibly terminated. When the processing unit 120 is stably restarted, the controller 140 may determine that only some of the operation elements 110 maintain operation states thereof. Whereas, when the operation of the processing unit 120 is forcibly terminated, the controller 140 may determine that all operation elements 110 maintain the operation states thereof.

Meanwhile, a criterion of the controller 140 may be determined by a preset algorithm, the criterion being used to determine whether the controller 140 maintains entirely or selectively the operation states of the one or more operation elements 110 in response to the operation situation of the processing unit 120. The algorithm may be changed depending on a design of the substrate processing apparatus 100, and detailed description thereof will be omitted.

Meanwhile, when the operation of the processing unit 120 is restarted or terminated, the controller 140 may receive the maintenance ranges of the operation states of the one or more operation elements 110 from the outside.

Figure 3:
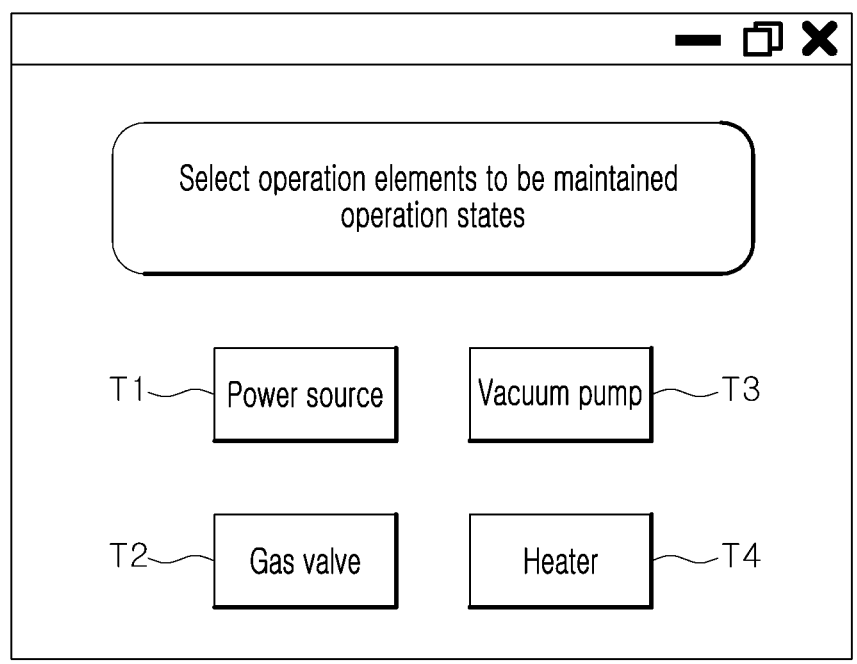
FIG. 3 is a view showing a display screen on which a graphic for inputting a maintenance range of an operation state of each of operation elements is output.

In more detail, as shown in FIG. 3, a graphic through which the maintenance ranges of the operation states of the operation elements 110 are input may be output on the display screen. The display screen may output the overall operation situation of the substrate processing apparatus 100, and may be provided at one side of the substrate processing apparatus 100.

When the substrate processing apparatus 100 is re-operated after the operation of the processing unit 120 is restarted or terminated, a plurality of touch buttons T1, T2, T3, and T4 may be output on the display screen. In this state, a user can select one or more operation elements 110 in the plurality of touch buttons T1, T2, T3, and T4. The controller 140 may check one or more operation elements 110 selected by the user, and maintain only operation states of the selected operation elements 110. Accordingly, according to the operation situation of the substrate processing apparatus 100, the operation elements 110 are properly selected so that the operation of the substrate processing apparatus 100 may be efficiently performed.

Figure 4:
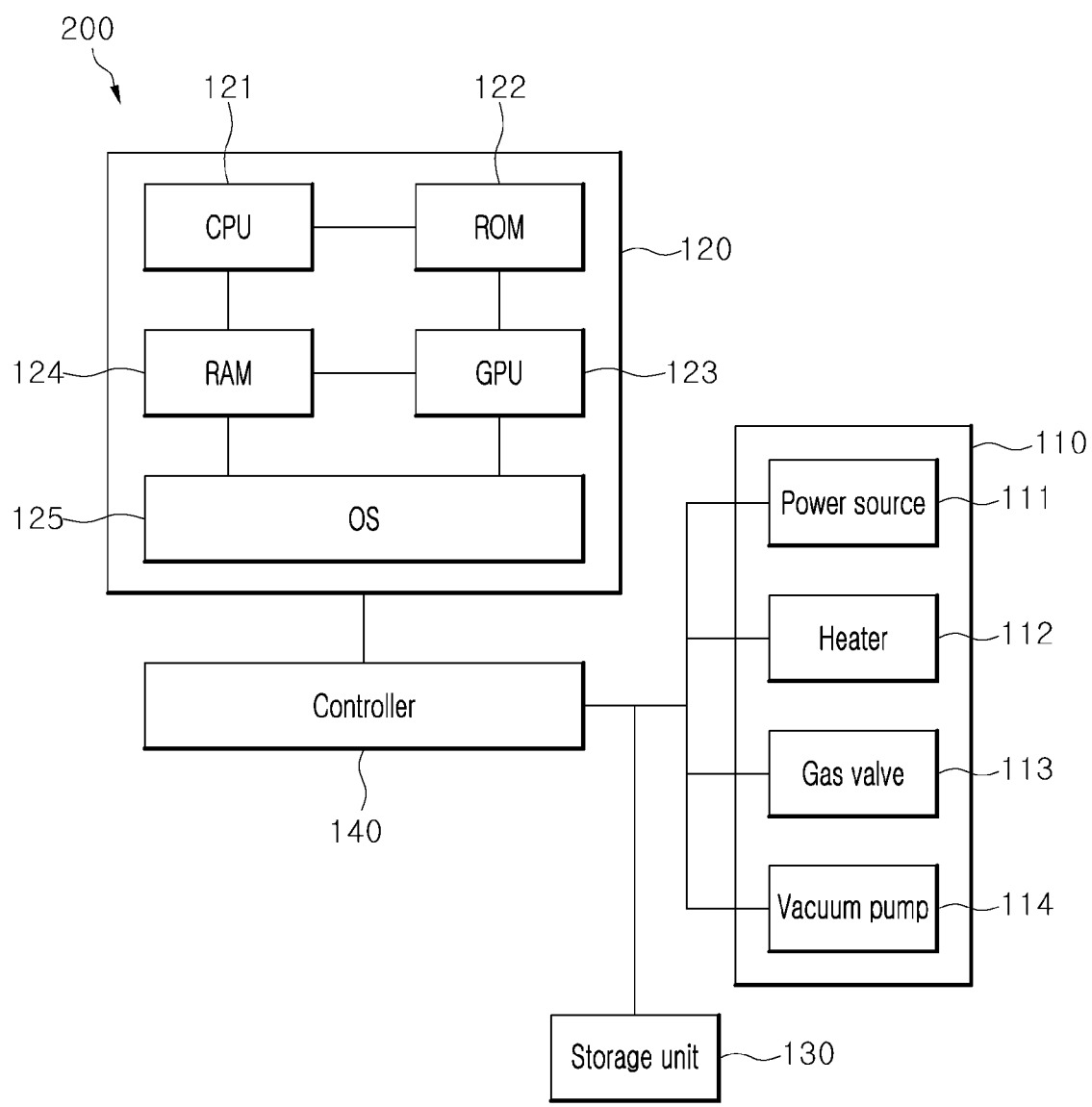
FIG. 4 is a block diagram showing a substrate processing apparatus according to another embodiment of the present invention.

Referring to FIG. 4, a substrate processing apparatus 200 according to another embodiment of the present invention may include a storage unit 130. In an exemplary embodiment, the storage unit 130 may be a non-volatile memory such a hard disk memory and a solid-state drive (SSD).

The storage unit 130 may store operation data for operation conditions of the one or more operation elements 110. The operation data may be stored in the storage unit 130 in real time or at regular intervals. The above-described controller 140 may reset the one or more operation elements 110 on the basis of the operation data stored in the storage unit 130.

In more detail, when power outage occurs, since power is not supplied from the power source 111 after the operation of the substrate processing apparatus 200 is forcibly terminated, it may be difficult to maintain the operation states of the operation elements 110. However, the substrate processing apparatus 200 according to another embodiment of the present invention is configured such that the operation data immediately before the operation of the substrate processing apparatus 200 is terminated is stored in the storage unit 130.

Therefore, when the operation of the substrate processing apparatus 200 is terminated for some time and then restarted, the controller 140 loads the operation data stored in the storage unit 130 to reset the operation elements 110. Accordingly, an operation condition of the re-operated substrate processing apparatus 200 may be quickly restored to an operation condition similar to an operation condition immediately before the operation of the substrate processing apparatus 200 is terminated.

In addition, the restarted processing unit 120 should also recognize the operation data for the operation elements 110, thus the operation data for the operation elements 110 stored in the storage unit 130 may be loaded to the processing unit 120.

In the substrate processing apparatus 100 according to the above-described embodiment of the present invention, the operation element 110 may be independently controlled by the controller 140. Therefore, even when the operation of the processing unit 120 is restarted or terminated, the operation elements 110 may be maintained without initialization.

Accordingly, since a state inside the chamber 115 may be maintained after the substrate processing apparatus 100 is restarted, time is not required to re-establish the state inside the chamber 115, when the processing unit 120 is restarted. That is, after the OS is reset due to regular maintenance or abnormalities of the substrate processing apparatus 100, operational inefficiency by restarting the substrate processing apparatus 100 may be reduced, and operational cost of the substrate processing apparatus 100 may be significantly reduced.

A control method according to embodiments of the present invention for the above-described substrate processing apparatus 100 will be as follows.

Figure 5:
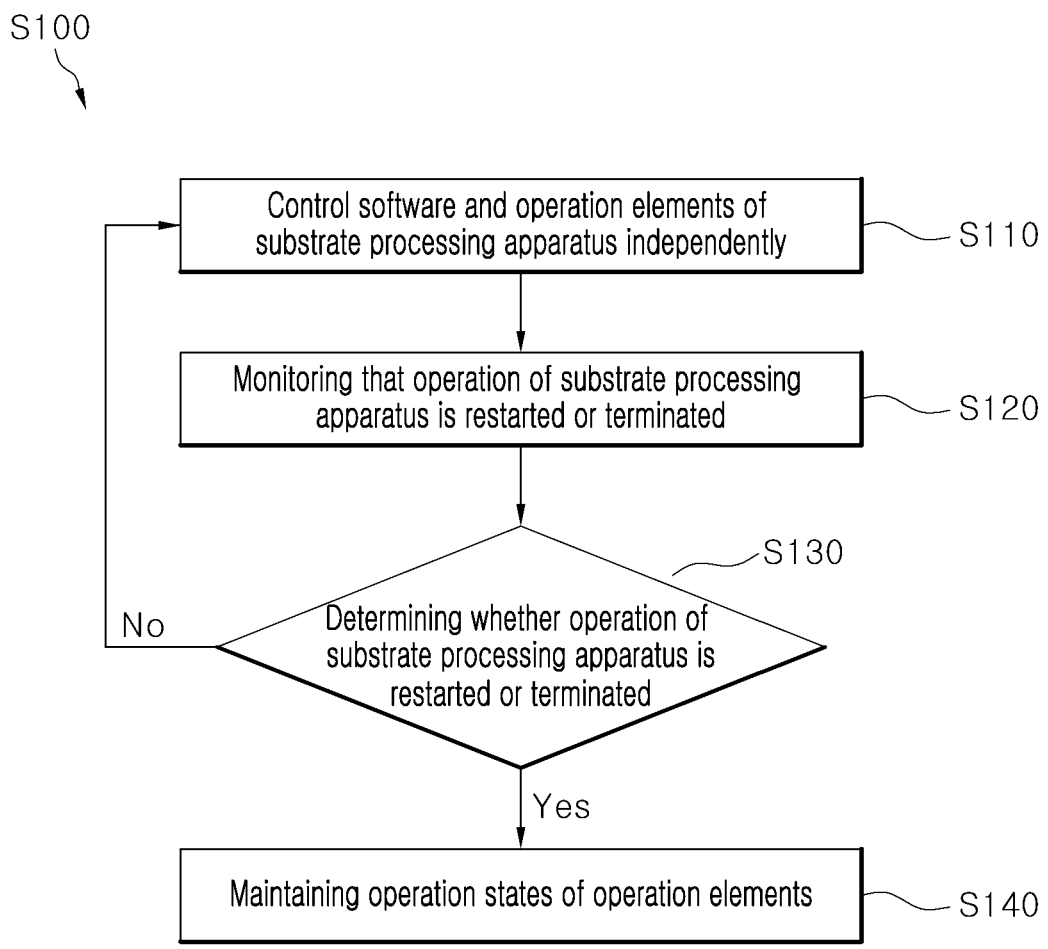
FIG. 5 is a flowchart showing a control method according to a first embodiment of the present invention for the substrate processing apparatus.

Referring to FIG. 5, a control method S100 according to a first embodiment of the present invention for the substrate processing apparatus includes controlling S110, monitoring S120, determining operation S130, and maintaining S140.

In the controlling S110, the control for software of the substrate processing apparatus and the control for operation elements are performed independently from each other. As described above, the operation elements that are hardware may be independently controlled by the controller.

In the monitoring S120, restart and termination of the substrate processing apparatus may be monitored. It may be preferable that the restart and the termination of the substrate processing apparatus are monitored in real time.

In the determining operation S130, it may be determined whether the operation of the substrate processing apparatus is restarted or terminated. A method for detecting that the OS included in the above-described processing unit is rebooted may be used as a method for determining whether the substrate processing apparatus is restarted, and a method for detecting that the processing unit is stopped may be used as a method for determining whether the operation of the substrate processing apparatus is terminated, but the present invention is not limited thereto.

In the maintaining S140, when the operation of the substrate processing apparatus is restarted or terminated, the operation states of the operation elements may be maintained. The operation states of the operation elements may be maintained entirely or selectively, when the operation of the substrate processing apparatus is restarted or terminated.

Figure 6:
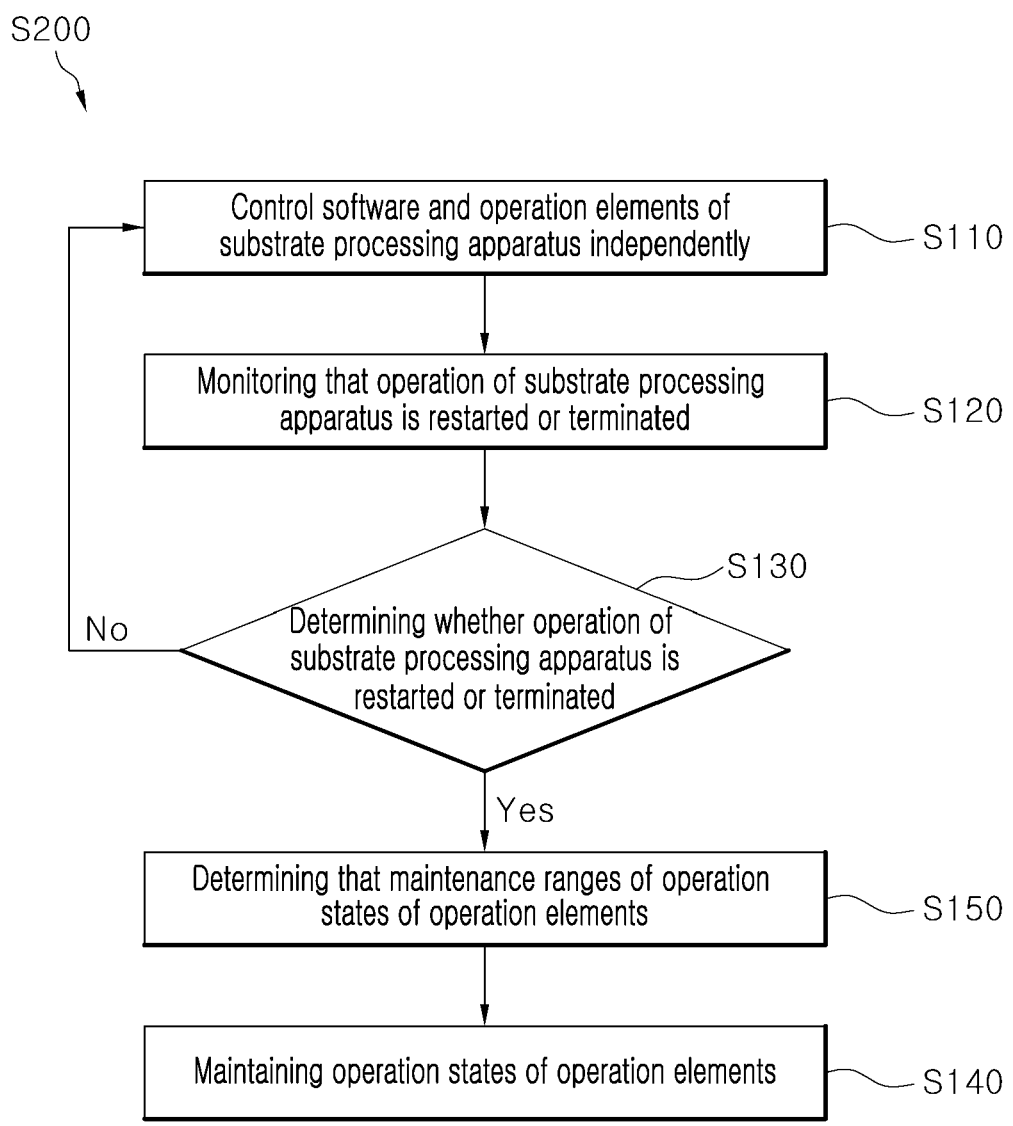
FIG. 6 is a flowchart showing a control method according to a second embodiment of the present invention for the substrate processing apparatus.

Referring to FIG. 6, a control method S200 according to a second embodiment of the present invention for the substrate processing apparatus may include determining the maintenance range S150.

In the determining the maintenance range S150, when the operation of the substrate processing apparatus is restarted or terminated, the maintenance ranges of the operation states of the operation elements may be determined. As described in the above-described substrate processing apparatus, the maintenance ranges of the operation states of the operation elements may be automatically determined by the above-described controller in response to a situation where the operation of the substrate processing apparatus is terminated.

Figure 7:
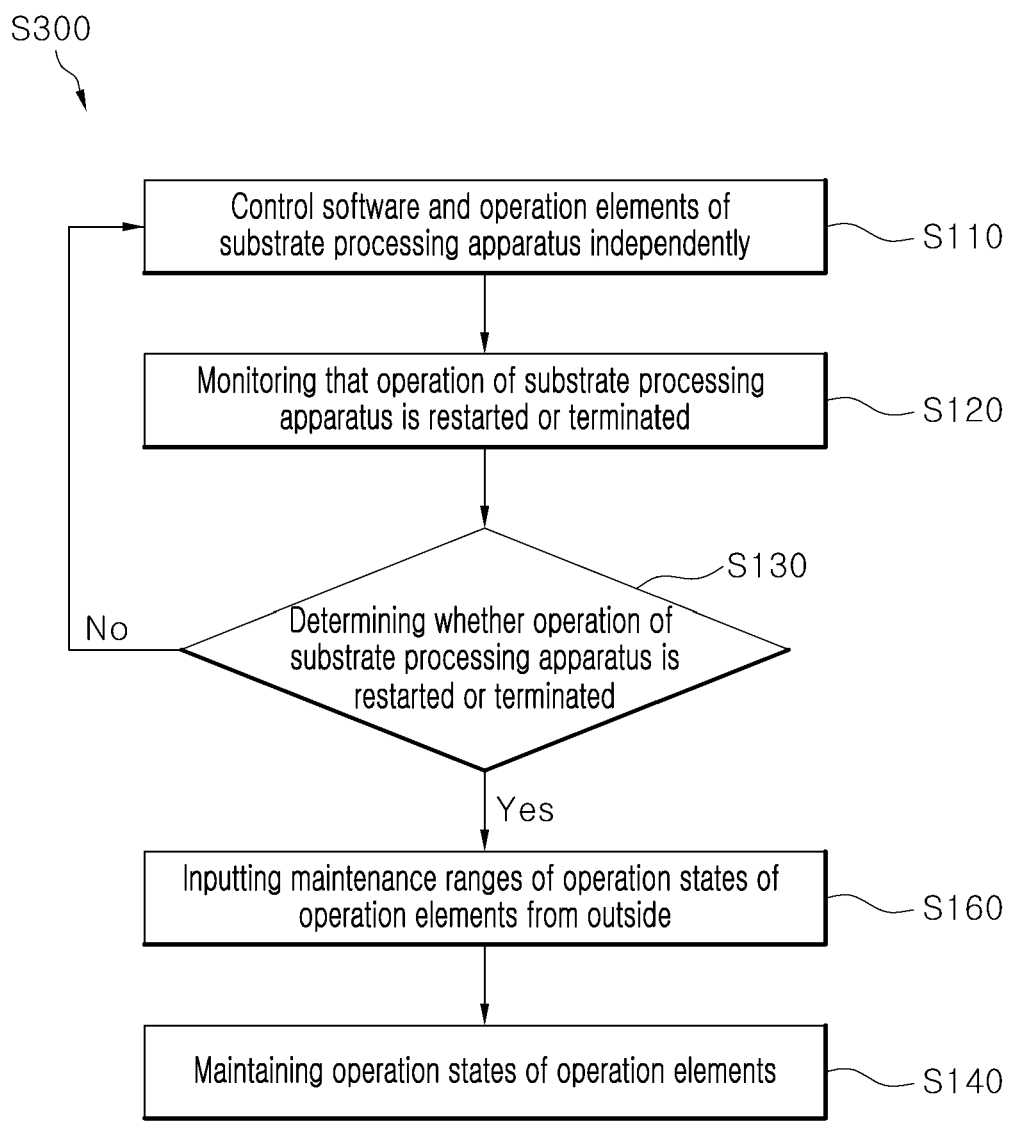
FIG. 7 is a flowchart showing a control method according to a third embodiment of the present invention for the substrate processing apparatus.

Referring to FIG. 7, a control method S300 according to a third embodiment of the present invention for the substrate processing apparatus may include inputting S160.

In the inputting S160, when the operation of the substrate processing apparatus is restarted or terminated, the maintenance ranges of the operation states of the operation elements may be inputted from the outside. The inputting S160 and the determining the maintenance range S150 have been described in the above-description of the substrate processing apparatus in detail, and the description thereof will be omitted.

Figure 8:
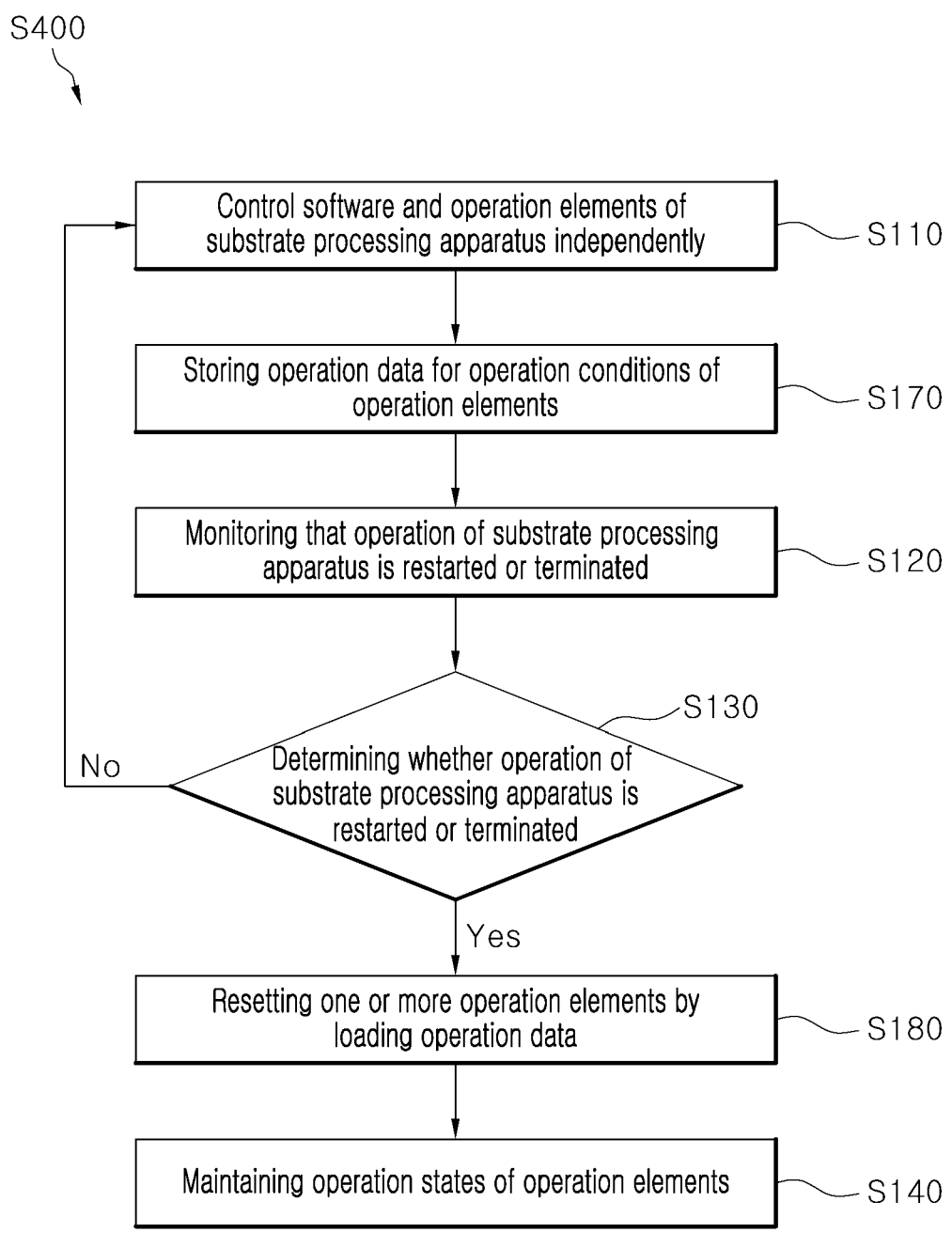
FIG. 8 is a flowchart showing a control method according to a fourth embodiment of the present invention for the substrate processing apparatus.

Referring to FIG. 8, a control method S400 according to a fourth embodiment of the present invention for the substrate processing apparatus may include storing S170 and resetting S180.

In the storing S170, the operation data for the operation conditions of the operation elements may be stored. The operation data for the operation conditions of the operation elements may be stored in real time or at the regular intervals as described above. In the resetting S180, when the operation of the substrate processing apparatus is restarted or terminated, the operation data is loaded and to be used for resetting the one or more operation elements.

Since the control method S400 according to a fourth embodiment of the present invention for the substrate processing apparatus includes the storing S170 and the resetting S180, when the above-described maintaining S140 is difficult to be executed immediately after the operation of the substrate processing apparatus is restarted or terminated, the operation elements may be reset on the basis of the operation data. Accordingly, the operation condition of the re-operated substrate processing apparatus may be quickly restored to the operation condition immediately before the operation of the substrate processing apparatus is terminated.

In addition, when only the processing unit 120 is restarted in the state where the operation data of the operation elements 110 are entirely or selectively maintained, the restarted processing unit 120 should also recognize the operation data of the operation elements 110, thus the operation data of the operation elements 110 stored in the storage unit 130 may be loaded to the processing unit 120 and may be used for resetting the operation elements.

In the control methods S100, S200, S300, and S400 for the substrate processing apparatus according to the present invention, even when the operation of the substrate processing apparatus is restarted or terminated, the operation elements may be controlled independently from the software control, so that the operation elements can be maintained without initialization. Therefore, since the state inside the chamber can be maintained, it is possible to secure time necessary for reestablishing the state inside the chamber 115 when the substrate processing apparatus is restarted. Accordingly, operating time due to the restart of the substrate processing apparatus may be reduced.

Although preferred embodiments of the present invention has been described for illustrative purposes, they are used only for the purpose of describing the present invention and are not intended to limit meaning or the scope of the present invention as defined in the claims. Therefore, those skilled in the art will appreciate that various modifications, additions and substitutions are possible. The scope of the protection of the present invention should be defined by the spirit of the claims and equivalents thereof.

What is claimed is:

1. A substrate processing apparatus including one or more operation elements, the substrate processing apparatus comprising:
    a processing unit configured to control operation of the substrate processing apparatus, wherein the processing unit is in an operating status including a first operating state of the processing unit being restarted for updating an operating system (OS) of the process unit and a second operating state of the processing unit being terminated due to power outage; and
    a controller configured to:
    receive, when the operation of the processing unit is in one of the first operating state and the second operating state, maintenance ranges of operation states of at least one operation element selected from the one or more operation elements from a source outside of the substrate processing apparatus;
    determine whether the processing unit is in the first operating state or the second operating state;
    operate, during a time when the processing unit is in the first operating, the one or more operation elements of the substrate processing apparatus to maintain the operation states of at least one operation element selected from the one or more operation elements within the maintenance ranges of the operation states; and
    operate, during a time when the processing unit is in the second operating state, the one or more operation elements of the substrate processing apparatus to maintain the operation states of all of the one or more operation elements.

2. The substrate processing apparatus of claim 1, further comprising:
    a storage unit configured to store operation data for operation conditions of the one or more operation elements,
    wherein the controller is further configured to reset the one or more operation elements on the basis of the operation data stored in the storage unit, or load the operation data stored in the storage unit to the processing unit.

3. The substrate processing apparatus of claim 1, wherein the one or more operation elements include an electrostatic chuck, a gas tank, a vacuum pump, or a power source.

4. A method of controlling a substrate processing apparatus including a processing unit, a controller, a plurality of operation elements, and a storage unit, the method comprising:
    inputting, when the operation of the processing unit is in one of a first operation state of the processing unit being restarted for updating an operating system (OS) of the process unit and a second operating state of the processing unit being terminated due to power outage, maintenance ranges of operation states of the plurality of operation elements from a source outside of the substrate processing apparatus;
    determining whether the processing unit is in the first operating state or the second operating state;
    operating, by the controller, operations of the plurality of operation elements during a time when the processing unit is in the first operating state of the processing unit to maintain the operation states of at least one operation element selected from the one or more operation elements within the maintenance ranges of the operation states of the plurality of operation elements; and
    operating, by the controller, operations of the plurality of operation elements during a time when the processing unit is in the second operating state of the processing unit, to maintain the operation states of all of the one or more operation elements.

5. The method of claim 4, further comprising:
    storing, by the controller, operation data for the operation states of the plurality of operation elements in the storage unit; and
    resetting, by the controller, the one or more operation elements on the basis of the operation data stored in the storage unit, when the operation of the processing unit is in one of the first operating state and the second operating state.

6. A method of controlling a substrate processing apparatus including a processing unit, a controller, a plurality of operation elements, and a storage unit, the method comprising:
    determining, when the operation of the processing unit is in one of a first operation state of the processing unit being restarted for updating an operating system (OS) of the process unit and a second operating state of the processing unit being terminated due to power outage, maintenance ranges of operation states of the plurality of operation elements; and
    operating, by the controller, operations of the plurality of operation elements during a time when the processing unit is in the first operatingto maintain the operation states of at least one operation element selected from the one or more operation elements within the maintenance ranges of the operation states of the plurality of operation elements; and
    operating, by the controller, operations of the plurality of operation elements during a time when the processing unit is in the second operating state of the processing unit, to maintain the operation states of all of the one or more operation elements.

7. The method of claim 6, further comprising:
    storing, by the controller, operation data for the operation states of the plurality of operation elements in the storage unit; and
    resetting, by the controller, the one or more operation elements on the basis of the operation data stored in the storage unit, when the operation of the processing unit is in one of the first operating state and the second operating state.

* * * * *